US011022877B2

(12) United States Patent
Grimbergen et al.

(10) Patent No.: US 11,022,877 B2
(45) Date of Patent: Jun. 1, 2021

(54) ETCH PROCESSING SYSTEM HAVING REFLECTIVE ENDPOINT DETECTION

(71) Applicant: APPLIED MATERIALS, INC., Santa Clara, CA (US)

(72) Inventors: Michael N. Grimbergen, Redwood City, CA (US); Khiem K. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 128 days.

(21) Appl. No.: 15/909,650

(22) Filed: Mar. 1, 2018

(65) Prior Publication Data

US 2018/0259848 A1    Sep. 13, 2018

Related U.S. Application Data

(60) Provisional application No. 62/483,758, filed on Apr. 10, 2017, provisional application No. 62/470,850, filed on Mar. 13, 2017.

(51) Int. Cl.
*H01L 21/67* (2006.01)
*G03F 1/80* (2012.01)
(Continued)

(52) U.S. Cl.
CPC .................. *G03F 1/80* (2013.01); *G03F 1/22* (2013.01); *G03F 1/36* (2013.01); *G03F 1/42* (2013.01);
(Continued)

(58) Field of Classification Search
USPC ........................ 156/345.24–345.28; 438/7–18
See application file for complete search history.

(56) References Cited

U.S. PATENT DOCUMENTS

| 5,450,205 A | 9/1995 | Sawin et al. |
| 5,648,849 A * | 7/1997 | Canteloup ............. B24B 37/013 |
| | | 257/E21.528 |

(Continued)

FOREIGN PATENT DOCUMENTS

| JP | S6035551 A | 2/1985 |
| JP | 2004/513509 | 4/2004 |

(Continued)

OTHER PUBLICATIONS

International Search Report and Written Opinion from PCT/US2018/021082 dated Jun. 20, 2018, 14 pgs.

(Continued)

*Primary Examiner* — Rakesh K Dhingra
(74) *Attorney, Agent, or Firm* — Schwabe, Williamson & Wyatt, P.C.

(57) ABSTRACT

Embodiments include wafer and photomask processing equipment. An etch processing system including an endpoint detection system having a light source and a photodetector is described. In an example, the light source emits light toward an alignment region over a substrate support member of an etch chamber, and the photodetector receives a reflection of the light from the alignment region. The reflection is monitored for endpoint and process control. A second light source emits light toward the alignment region, and a camera receives the light to image the alignment region. The image can be used to align the light emitted by the endpoint detection system to a spot location within the alignment region, e.g., within an alignment opening of a substrate mounted on the substrate support member.

13 Claims, 7 Drawing Sheets

(51) Int. Cl.
  *H01L 21/66* (2006.01)
  *G03F 1/22* (2012.01)
  *G03F 1/42* (2012.01)
  *G03F 1/36* (2012.01)
  *H01J 37/32* (2006.01)

(52) U.S. Cl.
  CPC .. *H01J 37/32935* (2013.01); *H01J 37/32963* (2013.01); *H01L 21/67069* (2013.01); *H01L 21/67253* (2013.01); *H01L 22/12* (2013.01); *H01L 22/26* (2013.01)

(56) References Cited

U.S. PATENT DOCUMENTS

| | | | | |
|---|---|---|---|---|
| 5,814,365 | A * | 9/1998 | Mahawili | C23C 16/455 427/10 |
| 2002/0102749 | A1 | 8/2002 | Fielden et al. | |
| 2007/0256786 | A1 * | 11/2007 | Zhou | H01L 21/02002 156/345.34 |
| 2008/0099436 | A1 * | 5/2008 | Grimbergen | G03F 1/80 216/60 |
| 2013/0059403 | A1 * | 3/2013 | Lee | H01L 21/67248 438/17 |
| 2013/0130409 | A1 * | 5/2013 | Grimbergen | G03F 1/80 438/8 |
| 2013/0157387 | A1 * | 6/2013 | Chen | H01J 37/32963 438/5 |
| 2013/0157388 | A1 * | 6/2013 | Grimbergen | H01L 22/12 438/9 |
| 2013/0180660 | A1 * | 7/2013 | Nozawa | H01L 22/26 156/345.24 |
| 2015/0111315 | A1 | 4/2015 | Grimbergen | |
| 2015/0226540 | A1 * | 8/2015 | Rajagopalan | G01N 21/55 118/728 |
| 2017/0062290 | A1 | 3/2017 | Miller et al. | |

FOREIGN PATENT DOCUMENTS

| | | |
|---|---|---|
| JP | H08-054210 | 4/2004 |
| JP | 2013/048183 | 3/2013 |
| TW | 201331703 | 8/2013 |
| TW | 201331704 | 8/2013 |
| WO | WO 2011/016525 | 1/2013 |

OTHER PUBLICATIONS

International Preliminary Report on Patentability from PCT/US2018/021082 dated Sep. 26, 2019, 10 pgs.
Official Letter from Taiwanese Patent Application No. 107107808 dated Mar. 26, 2020, 14 pgs.
Notice of Reasons for Rejection from Japanese Patent Application No. 2019-548651 dated Nov. 25, 2020, 9 pgs.

* cited by examiner

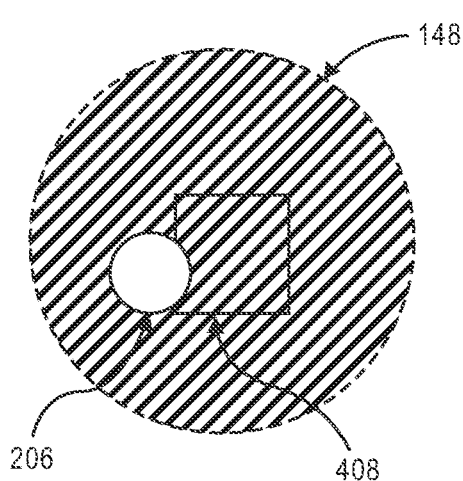
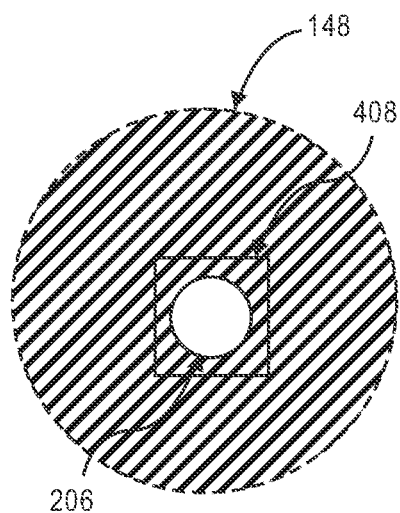
FIG. 6A     FIG. 6B
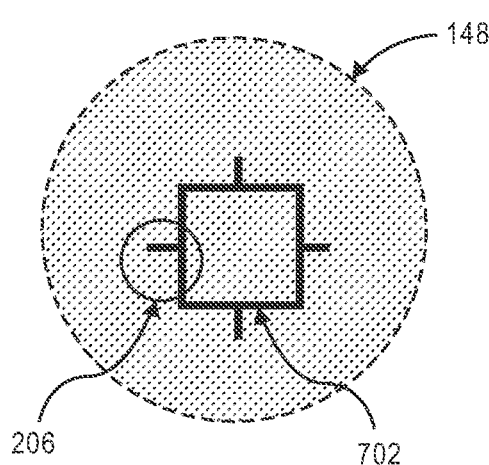
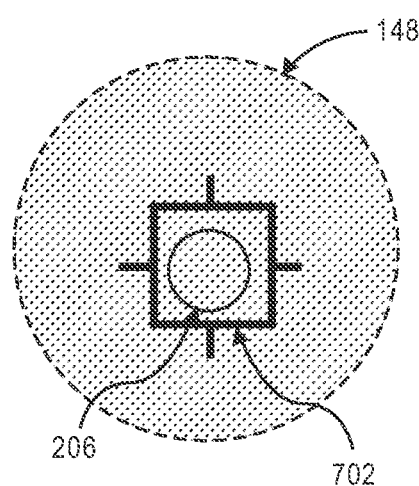
FIG. 7A     FIG. 7B

ETCH PROCESSING SYSTEM HAVING REFLECTIVE ENDPOINT DETECTION

CROSS-REFERENCE TO RELATED APPLICATIONS

This application claims the benefit of U.S. Provisional Application No. 62/470,850, filed on Mar. 13, 2017 and U.S. Provisional Application No. 62/483,758, filed on Apr. 10, 2017, the entire contents of which are hereby incorporated by reference herein.

BACKGROUND

1) Field

Embodiments relate to the field of semiconductor processing and, in particular, to etch processing equipment having an endpoint detection capability.

2) Description of Related Art

Critical dimensions in semiconductor products continue to shrink. The ongoing miniaturization is enabled by improvements in the capabilities of wafer processing equipment. Endpoint process control is a capability of wafer processing equipment that detects an endpoint of a wafer manufacturing process, e.g., an etching process. For example, an endpoint of an etching process can occur when an etch layer, such as a thin oxide layer, is removed from a base layer, e.g., an underlying silicon layer. An accuracy and precision of such endpoint detection can depend on, for example, an accuracy of collected etch rate data.

SUMMARY

Embodiments of an etch processing system that includes endpoint detection based on reflectance monitoring, i.e., reflective endpoint detection, are described. The etch processing system includes an etch chamber having a chamber body around a substrate support member. A substrate can be mounted on the substrate support member, and etching of the substrate can be performed in an etching process by the etch chamber. The etch processing system includes an endpoint detection system to monitor reflections of light from the substrate during etching. More particularly, the etch processing system can include one or more light sources to emit light toward an alignment region on the substrate, and the endpoint detection system can include a photodetector to receive a reflection of the light from substantially within the alignment region. The endpoint detection system can monitor reflectance changes during etching to determine when an endpoint is reached.

In an embodiment, reflectance monitoring includes measuring reflectance from a substrate surface that is not covered by a mask layer. The reflectance changes from the mask layer may provide a signal that is different from the desired signal for process control, such as ending the process when an etch layer is removed. Accordingly, the reflectance monitoring may measure reflections from the substrate surface being etched instead of the mask layer. In an embodiment, light emitted by a light source of the endpoint detection system is focused into a beam spot on the substrate surface, and the beam spot can be aligned to an alignment opening in the mask layer. For example, etch processing system can include a camera to image a reflection of the beam spot, and the image may be used to move the beam spot to a spot location within the alignment opening.

An optical beam splitter may be added in the optical path of the light going to the substrate and/or returning from the substrate to direct a portion of the reflected light from the substrate toward a camera. The camera can image the reflected light to capture a visual image of the surface being monitored. The position of the optical assembly is then adjusted to view the desired area that has no mask layer. The beam splitter can be retained in the assembly since it causes minimal loss in diverting light to the second optical path. The camera can be retained in position or removed once the adjustment has been made and the position is fixed.

Embodiments include focusing optics to focus light into the beam spot and to direct light to the photodetector and the camera of the optical monitoring system. The focusing optics can incorporate reflective optics, which are wavelength-independent. With reflective optics, the focal point and beam spot size is the same at all wavelengths. Focus adjustment and evaluation of the spot size and location can then be done at a single wavelength. This single wavelength can be conveniently chosen in the visible part of the spectrum for set-up, and the same focus will apply to a broad range of wavelengths, from the deep UV to the near IR for process monitoring and control. The optic surfaces of the focusing optics may have a coating that has high reflectivity over the intended range of wavelengths.

The photodetector can detect a magnitude of the reflection of the beam spot. A change in the magnitude may vary depending on a moment within the etching process. For example, the beam spot may have a certain reflectance from an etch layer of substrate, and when the etch layer is completely removed by the etching process, the reflectance may be a different value. When the different value (or a difference in a rate of change in the reflectance value) occurs, the etch processing system may determine that an endpoint of the etching process is reached.

The above summary does not include an exhaustive list of all aspects. It is contemplated that all systems and methods are included that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

FIGS. 6A-6B are top views of an alignment region of a substrate, in accordance with an embodiment.

FIGS. 7A-7B are top views of a substrate and an alignment reticle, in accordance with an embodiment.

DETAILED DESCRIPTION

Etch processing systems, and methods of using such systems to determine an endpoint of an etching process based on reflectance from an alignment region, are described. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Endpoint process control capabilities of existing wafer processing equipment can monitor reflectance of a wafer or photomask to determine when etching of the wafer or photomask is complete. This monitoring, however, is subject to inaccuracies that limit an accuracy of the process control. More particularly, the monitoring is subject to masking layer effects caused by the patterned masking layer over the wafer or photomask. The masking layer is typically formed from a photoresist material that reflects light. The light reflected by the masking layer can interfere with light reflected from the underlying layer on the wafer or photomask. The optical interference can obscure measurements of the reflected light, which the endpoint process control is based on. Thus, an etch processing system having an endpoint process control capability that is independent of masking layer effects can improve wafer and photomask processing accuracy. To clarify this terminology, a masking layer may be used for etching and can be on either a patterned wafer or a patterned photomask substrate.

In an aspect, an etch processing system has reflective endpoint process control. The etch processing system includes an endpoint detection system to emit light toward an alignment region of a substrate, e.g., a wafer or photomask. The alignment region can include an alignment opening in a patterned mask layer of the substrate. A camera may simultaneously capture an image of the alignment region, and the image may be used to align the light to the alignment opening. A reflection of the light from a base layer of the substrate under the alignment opening can be received by the endpoint detection system to determine an endpoint of an etching process. That is, the wafer may be etched and the light reflected from the alignment opening that does not include photoresist material may be measured to detect an endpoint of the etching process. The endpoint detection may be unobscured by masking layer effects.

Figure 1:
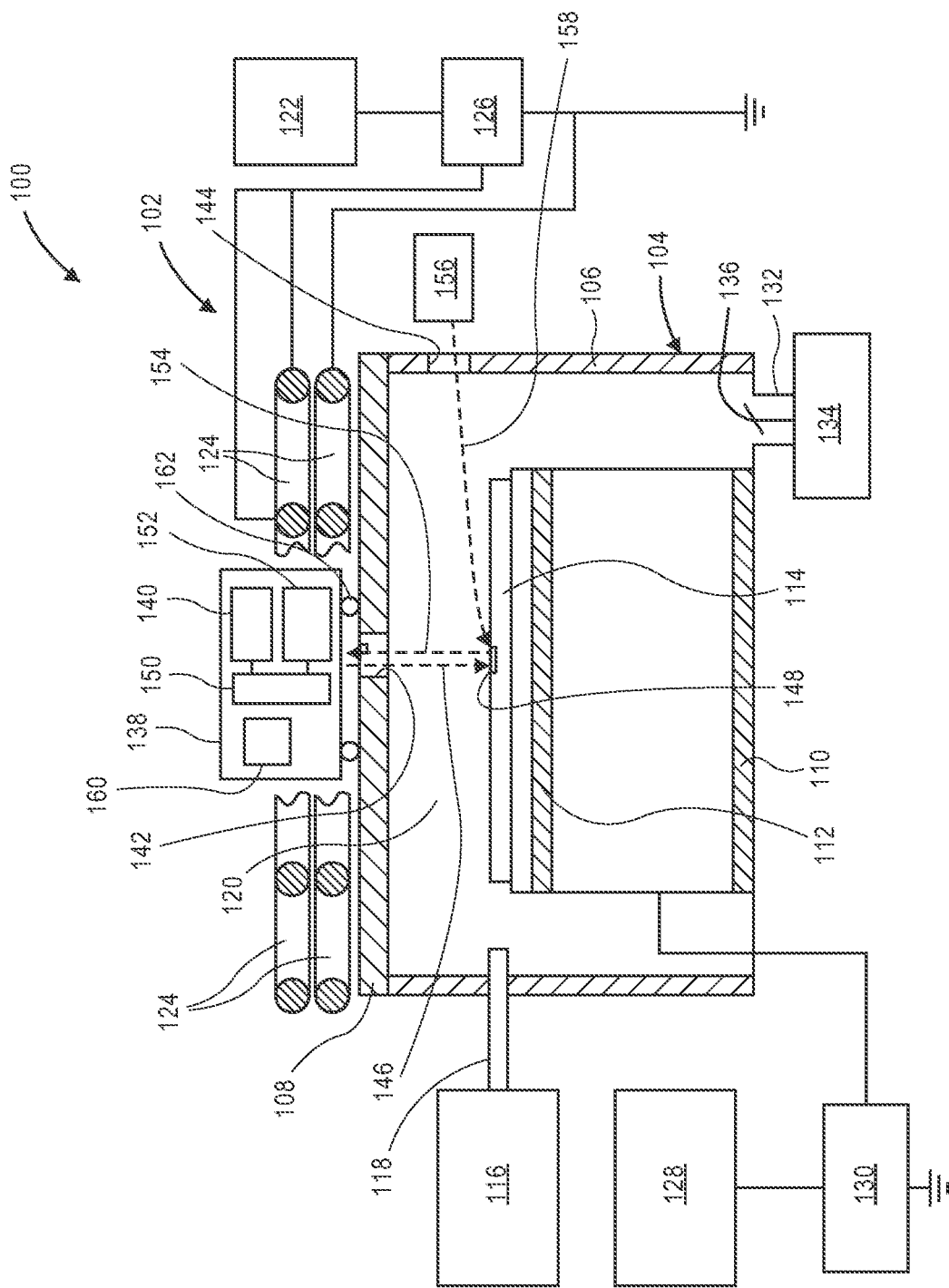
FIG. 1 is a schematic of an etch processing system, in accordance with an embodiment.

Referring to FIG. 1, a schematic of an etch processing system is shown in accordance with an embodiment. An etch processing system 100 can include an etch chamber 102. Etch chamber 102 can be a plasma etch chamber, a capacitive coupled parallel plate chamber, or a magnetically enhanced ion etch chamber. Etch chamber 102 may be an inductively coupled plasma etch chamber. Accordingly, it is recognized that the particular embodiment of etch chamber 102 illustrated in FIG. 1 is illustrative, and not limiting.

Etch chamber 102 may include a chamber body 104. Chamber body 104 can include a chamber wall 106, e.g., a cylindrical sidewall, and a chamber lid 108 mounted on chamber body 104. Chamber lid 108 may be flat, rectangular, arcuate, conical, dome or multi-radius shaped. Chamber body 104 may also include a chamber bottom 110. Accordingly, a chamber volume can be enclosed within chamber body 104 between chamber wall 106, chamber lid 108, and chamber bottom 110. Portions of chamber body 104, e.g., chamber wall 106, can be made of a metal, such as anodized aluminum, and portions of chamber body 104, e.g., chamber lid 108, can be made of an energy transparent material such as a ceramic or other dielectric material.

A substrate support member 112 may be disposed within the chamber volume. More particularly, chamber body 104 may extend around substrate support member 112. In an embodiment, substrate support member 112 supports a substrate 114 within etch chamber 102. For example, substrate 114 may be mounted on substrate support member 112 during an etching process. When substrate 114 is loaded onto substrate support member 112, etch processing system 100 may be referred to as an etching process assembly.

Substrate support member 112 may be a conventional mechanical or electrostatic chuck with at least a portion of the substrate support member 112 being electrically conductive and capable of serving as a process bias cathode. While not shown, a photomask adapter may be used to secure a photomask on the substrate support member 112. The photomask adapter generally includes a lower portion configured to cover an upper portion of the substrate support member 112, and a top portion having an opening, e.g., a square opening, sized and shaped to hold a photomask.

Etch chamber 102 can include a process gas source 116 configured to introduce process gases into the chamber volume through a gas distributor 118. Gas distributor 118 may be peripherally disposed about substrate support member 112 and/or disposed in chamber lid 108. Mass flow controllers (not shown) for each process gas, or alternatively, for mixtures of the process gas, may be disposed between the chamber body 104 and the process gas source 116 to regulate the respective flow rates of the process gases.

In an embodiment, a plasma zone 120 is defined in the chamber volume between the substrate support member 112 and the chamber lid 108. A plasma is generated in the plasma zone 120 from the process gases by supplying power from a power supply 122, e.g., a coil power supply, to inductive coils 124 through an RF match network 126. Etch chamber 102 can include at least one inductive coil 124 disposed above at least a portion of chamber lid 108. In the embodiment depicted in FIG. 1, two concentric coils 124 are shown.

The substrate support member 112 may include an electrode disposed therein, which is powered by an electrode power supply 128 and generates a capacitive electric field in the etch chamber 102 through an RF match network 130. Typically, RF power is applied to the electrode in the substrate support member 112 while chamber body 104 is electrically grounded. The capacitive electric field, which is transverse to the plane of substrate support member 112, influences the directionality of charged species to provide more anisotropic etching of substrate 114.

Process gases and etchant byproducts are exhausted from etch chamber 102 through an exhaust port 132 to an exhaust system 134. Exhaust port 132 may be disposed in chamber body 104, e.g., within chamber bottom 110, for removal of process gases. A throttle valve 136 can be provided in exhaust port 132 for controlling the pressure in the chamber volume of etch chamber 102.

In an embodiment, etch processing system 100 includes an optical monitoring system 138 operatively coupled to etch chamber 102. Optical monitoring system 138 can include an endpoint detection system 140 configured to determine an endpoint of an etching process, e.g., an etch rate or a removal of a layer thickness from substrate 114. Endpoint detection system 140 may be configured to detect optical signals from the chamber volume of etch chamber 102.

In an embodiment, chamber lid 108 includes one or more lid windows 142. A lid window 142 may an optical access port or viewport in chamber lid 108. Similarly, one or more optical access ports or viewports may be located in chamber wall 106 or chamber bottom 110 to allow light transfer into and out of the chamber volume. Lid window 142 may be at a central region of chamber lid 108. In general, a larger lid window 142 facilitates the installation of optical components. The size of lid window 142, however, is selected to be sufficiently large for optical monitoring, yet small enough to avoid potential adverse impact from RF interference. Selecting a small lid window 142 also improves the lateral temperature uniformity of the chamber lid 108. The optical access port may generally comprise a flat window made of quartz or other materials that transmits light over a broad wavelength spectrum and resists plasma etching.

Chamber lid 108 may include several lid windows 142 to provide several monitoring locations. For example, a first lid window 142 may be located near a perimeter of chamber lid 108 radially outward from a center of the lid at a first angular position (e.g., a zero degree position). A second lid window can be located near the perimeter radially outward from the center of the lid at a second angular position (e.g., at a 90 degree position relative to the first angular position). Optical monitoring system 138 can be aligned to either of the lid windows, depending on which lid window is located over an alignment opening of interest on substrate 114 mounted within chamber body 104.

The angular offset between lid windows 142 can be set to ensure that at least one lid window 142 is vertically above alignment opening, regardless of the orientation of substrate 114. For example, substrate 114 may include several alignment openings that can be used for endpoint monitoring as described below. Each of the alignment openings may be offset from each other by 180 degrees. That is, one alignment opening may be at a first angular position on substrate 114 and another alignment opening may be diametrically opposite of the first alignment opening on substrate 114. When substrate 114 is mounted within the chamber volume of a chamber having lid windows 142 offset by 90 degrees, at least one alignment opening will be below at least one lid window 142, so long as substrate 114 is mounted in 90 degree increments beginning at the zero degree location. Such a configuration can enable a position of optical monitoring system 138 to be placed at one of two locations to be above an alignment opening for process monitoring.

In an embodiment, chamber lid 108 is configured to be repeatedly and securely mounted on chamber body 104. For example, chamber lid 108 may have a tight tolerance with chamber body 104 to ensure that chamber lid 108 can be removed from chamber body 104, e.g., for system maintenance, and upon reassembly chamber lid 108 is oriented in a same location that it was located prior to disassembly. As such, lid windows 142 will be located at identical positions whenever chamber lid 108 is removed and re-mounted.

Repeatable mounting of chamber lid 108 can be enabled by one or more features. First, a key feature may exist between chamber lid 108 and chamber body 104 to ensure precise angular locating of chamber lid 108. In an embodiment, chamber lid 108 includes a key, e.g., a prong, that radiates from a lid perimeter. The key may be sized to engage with a groove formed in an edge of chamber body 104. Thus, when chamber lid 108 is mounted on chamber body 104 with the key in the groove, the relative angular position between the lid and body can be precisely controlled. Other types of key features could be utilized, such as a notch or flat region. Second, a relative radial location between chamber lid 108 and chamber body 104 can be controlled by providing a lead-in edge on chamber lid 108. The lead-in edge may have a wedge angle on the lid edge that tapers from a maximum dimension, e.g., diameter, at a higher location to a minimum dimension at a lower location. Accordingly, as chamber lid 108 is dropped into an opening of chamber body 104, the lower location will enter first as a sliding fit between the lid edge and the chamber wall, and the higher location will engage last as a slip or press fit between the lid edge and chamber wall. This gradual transition from a sliding fit to a slip or interference fit can also reduce binding between the chamber lid and body.

Endpoint detection system 140 is configured to detect optical signals through lid window 142. It is noted that more than one window may be formed in the chamber lid 108 or other boundary structures of etch chamber 102 to allow optical monitoring of various locations on a surface of substrate 114 during etching. For example, a side window 144 may be formed in chamber wall 106, and a light source may be coupled to side window 144 to transfer light into the chamber volume for etch process monitoring, as described below.

Endpoint detection system 140 may include a light source to emit a first light 146 toward an alignment region 148 over substrate 114. Endpoint detection system 140 may include focusing optics 150 to direct first light 146 along a forward light path from the light source through lid window 142 to alignment region 148. First light 146 may be a source of light for reflective endpoint monitoring. For example, endpoint detection system 140 may include a photodetector to receive a reflection 154 from the alignment region 148 through lid window 142. Reflection 154 may be a reflection 154 of first light 146 and/or other light within the chamber volume. Reflection 154 may travel from the chamber volume to endpoint detection system 140 through lid window 142. Focusing optics 150 may direct reflection 154 along a return light path from lid window 142 to endpoint detection system 140.

In an embodiment, optical monitoring system 138 includes a camera 152. Camera 152 may be disposed adjacent to endpoint detection system 140. For example, endpoint detection system 140, focusing optics 150, and camera 152 may be mounted within a same chassis of optical monitoring system 138 to assist viewing the substrate 114 through the same optical view port, e.g., lid window 142. That is, camera 152 may image reflection 154 from alignment region 148 to confirm that the first light 146 emitted by endpoint detection system 140 is directed to a correct location on substrate 114.

Reflection 154 may include first light 146 emitted by endpoint detection system 140 and other light reflected from alignment region 148. For example, etch processing system 100 may include a second light source 156 coupled to side window 144 to emit a second light 158 through side window 144 toward alignment region 148. Camera 152 may image the reflection 154 containing first light 146 and second light 158 from alignment region 148.

Figure 8A:
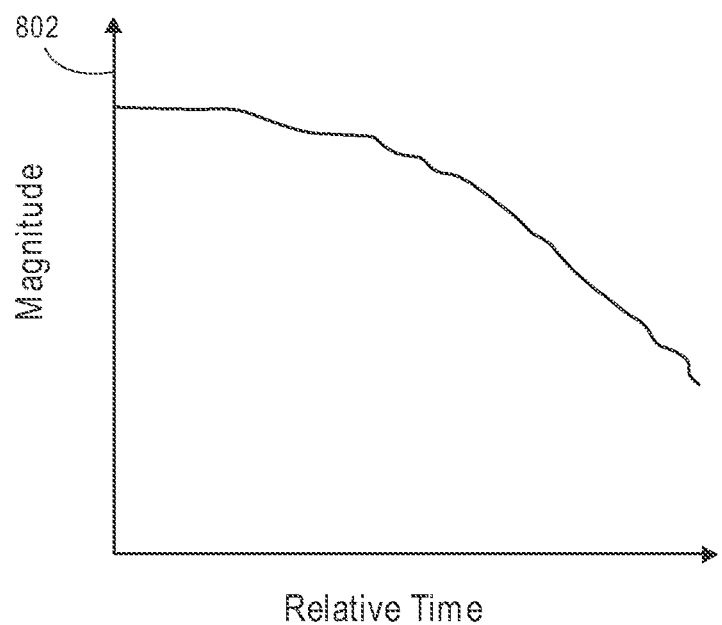
FIGS. 8A-8B are graphs of endpoint traces, in accordance with an embodiment.
Figure 8B:
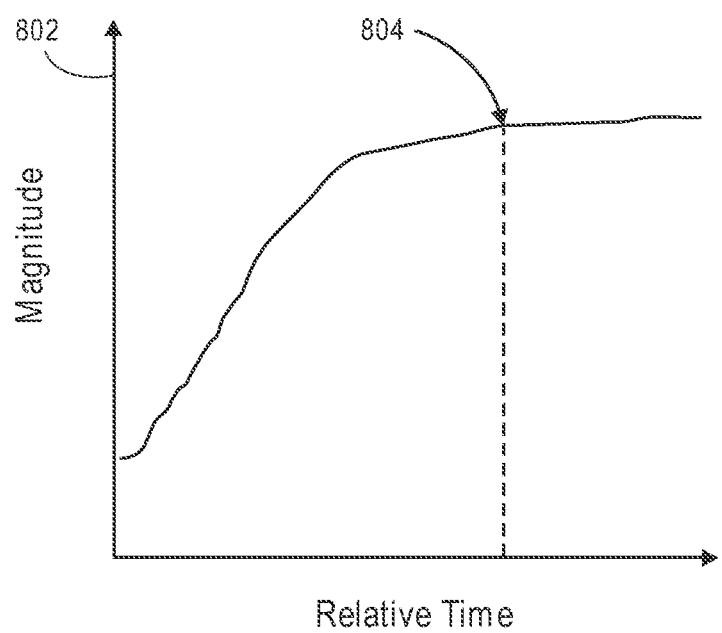

In an embodiment, endpoint detection system 140 operates in at least one of a reflection, interferometry, or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof. In a particular embodiment, endpoint detection system 140 is configured to determine an endpoint of an etching process based on a change in the reflectance, e.g., a change in a magnitude of reflection 154, from an etched surface of substrate 114 within alignment region 148 (FIGS. 8A-8B).

The reflection mode of operation allows reflectance (or reflectometry) and interferometric measurement to be performed. In an embodiment, optical monitoring system 138 includes a computer system 160, as described further below with respect to FIG. 9. Computer system 160 may calculate portions of a real-time waveform based on measured optical signals of the reflection 154 of first light 146 and compares the calculated waveform with a stored characteristic waveform pattern to extract information relating to the etch process. In one embodiment, the calculation may be based on slope changes or other characteristic changes in the detected signals, either in reflection or transmission mode. For example, the detected signals may have characteristic reflectance magnitudes 802 or changes when a film is etched to a target depth. Alternatively, the calculation may be based on interferometric signals as the depth of a trench or the thickness of a film changes during etching. In other embodiments, more detailed calculations may be performed based on interferometric signals obtained over a wide spectrum in order to determine the depth or thickness at any point in the etch process to determine etch rate of the object being etched.

Computer system 160 may control other functions of etch processing system 100. For example, in an embodiment, etch processing system 100 includes an adjustment mechanism 162 operably coupled to one or more of substrate support member 112 (not shown) or to endpoint detection system 140 (e.g., by moving the chassis of optical monitoring system 138 over lid window 142 as illustrated). Computer system 160 may control movement of adjustment mechanism 162 by actuating motors, servos, etc., to move a location that first light 146 impinges in alignment region 148 of substrate 114.

Figure 2:
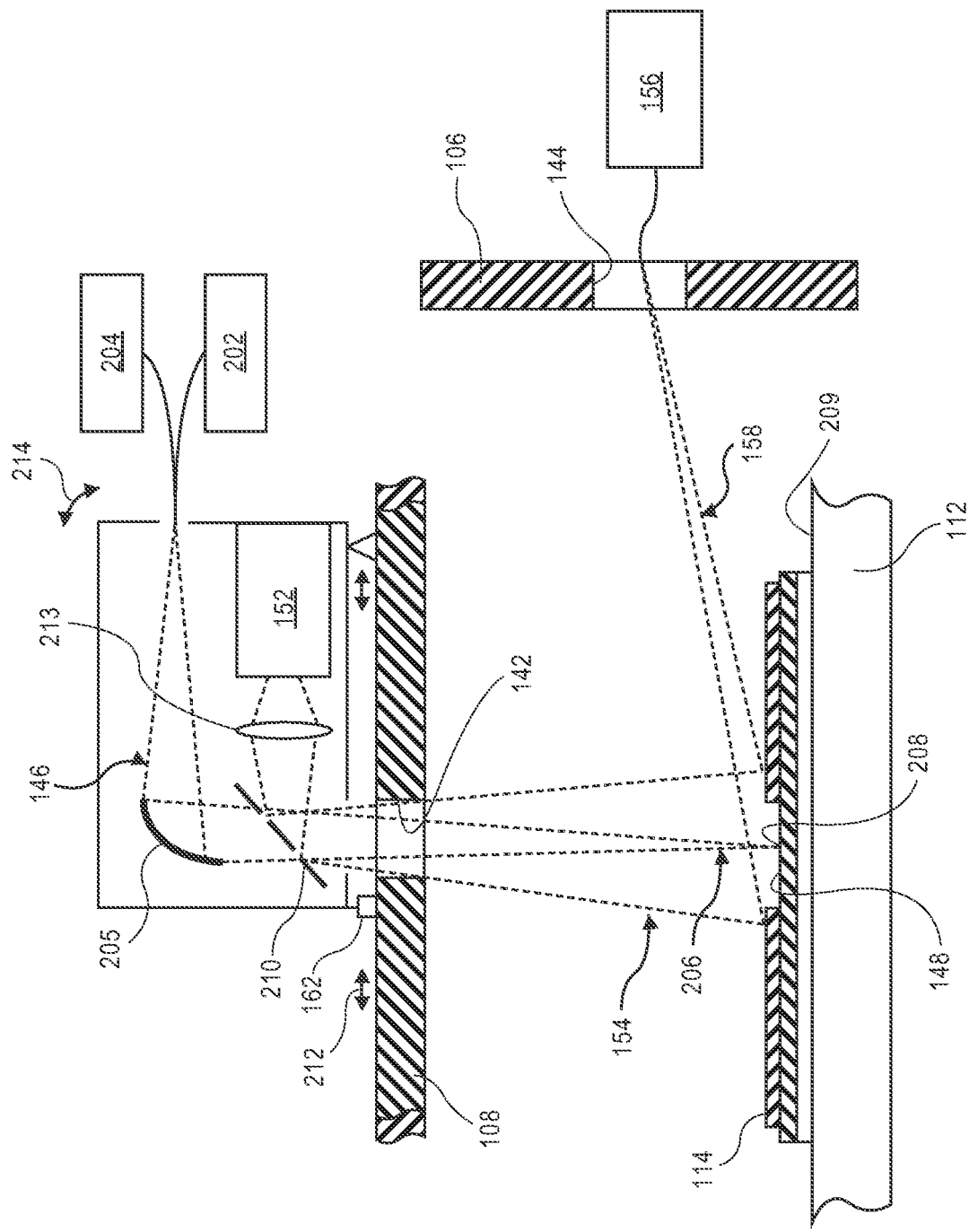
FIG. 2 is a diagram of an optical configuration of an etch processing system, in accordance with an embodiment.

Referring to FIG. 2, a diagram of an optical configuration of an etch processing system is shown in accordance with an embodiment. In an embodiment, endpoint detection system 140 includes a light source 202 to emit first light 146. First light 146 may be transferred to the optical assembly, i.e., focusing optics 150, by an optical fiber. In an embodiment, focusing optics 150 includes a curved mirror 205 to direct first light 146 along the forward path toward alignment region 148 through lid window 142. More particularly, curved mirror 205 may reflect and focus first light 146 into a beam spot 206 in alignment region 148. Beam spot 206 may be at a spot location 208 on a surface of substrate 114.

In an embodiment, reflection 154 of light is reflected from alignment region 148 and collected by photodetector 204. Reflection 154 can include first light 146 and second light 158 emitted by second light source 156. For example, first light 146 may be directed by focusing optics 150 in a downward direction to travel toward alignment region 148 orthogonal to a top surface 209 of substrate 114 and/or substrate support member 112. At the same time, second light 158 from second light source 156 may be directed laterally to enter the chamber volume through side window 144 in chamber wall 106. Second light 158 may travel toward alignment region 148 oblique or parallel to top surface 209. For example, second light 158 may travel at a low angle to top surface 209 to illuminate alignment region 148. At least a portion of second light 158 will reflect upward from alignment region 148 within a field of view of camera 152. That is, both first light 146 and second light 158 will reflect upward within reflection 154 toward lid window 142 that is positioned over alignment region 148. Reflection 154 travels through lid window 142 along the return path toward photodetector 204 and camera 152.

The light sources 156, 202 may be monochromatic, polychromatic, white light, or other suitable light sources. As described below, the optical signal from reflection 154 may be analyzed to extract information regarding the presence or absence of a layer. For example, reflection 154 of beam spot 206 can be analyzed to determine whether an etch layer, e.g., an anti-reflective coating layer or an absorber layer, has been removed during an etching process. Alternatively, the analysis can determine a thickness of certain material layers within the spot location 208. The intensity of the incident beam spot 206 is selected to be sufficiently high to provide a reflected optical beam with a measurable intensity. The lamp of the light source(s) can also be switched on and off to subtract background light.

In one embodiment, the light sources 156, 202 provide polychromatic light, e.g., from an Hg—Cd lamp, an arc lamp, or a light emitting diode (LED) or LED array, which generate light in wavelength range from 170 nm to about 800 nm, or about 200 to 800 nm, for example about 250 nm to about 800 nm respectively. The polychromatic light source 202 can be filtered to provide an incident optical beam having selected frequencies. The light source(s) can also comprise a flash lamp, e.g., a xenon (Xe) or other halogen lamp, or a monochromatic light source that provides optical emission at a selected wavelength. For example, light source 202 can be a He—Ne or ND-YAG laser.

Light source(s) 156, 202 may be configured to operate in a continuous or pulsed mode. Alternatively, the wavelength range may be expanded into the deep UV as low as 170 nm or more by using optical materials with stable deep UV transmission and purging air paths with inert gas or other suitable carrier gas, such as nitrogen gas.

Focusing optics 150 may direct reflection 154 of first light 146 and second light 158 to camera 152. More particularly, light reflected from alignment region 148 may be collected from a field of view. In an embodiment, focusing optics 150 includes a beam splitter 210 between camera 152 and lid window 142 to direct reflection 154 of first light 146 and second light 158 to camera 152. Reflection 154 can be reflected by beam splitter 210 into a lens 213. An image from lens 213 is then captured by the camera 152.

The field of view imaged by camera 152 may include second light 158 reflecting upward from alignment region 148 around beam spot 206. The image of alignment region 148, however, may also include the reflection of beam spot 206 from substrate 114. That is, first light 146 focused into beam spot 206 may be directed upward through lid window 142 to beam splitter 210, and beam splitter 210 may partially reflect beam spot 206 toward lens 213 to be collected by camera 152. Accordingly, the resulting image captured by camera 152 can be a composite image of the alignment region 148 on substrate 114 and showing beam spot 206 at spot location 208 within the alignment region 148. As described below, the image can be used to determine and adjust spot location 208 to align beam spot 206 to a predefined spot location, e.g., to align beam spot 206 to an alignment opening in a photomask on substrate 114.

Focusing optics 150 may direct reflection 154 of first light 146 to photodetector 204. More particularly, light reflected from alignment region 148 may pass a portion of reflection 154 containing reflected beam spot 206 (the portion not reflected to camera 152) to photodetector 204. More particularly, the passed reflection 154 may reflect from curved mirror 205 toward fiber optics that carry the optical signal to photodetector 204. Beam splitter 210 may be transmitting over a wide range of wavelengths, preferably down to 200 nm or below to retain the full wavelength range of photodetector 204.

Photodetector 204 may be configured to measure the intensity of a reflected optical beam reflected off the spot location 208 of the substrate 114. That is, photodetector 204 may detect or measure a magnitude of reflection 154 of beam spot 206. Focusing optics 150 can include color filters placed in front of photodetector 204 to filter out all wavelengths except for the desired wavelength of light, prior to measuring the intensity of the reflected optical beam entering the photodetector 204. The photodetector 204 may include a light-sensitive electronic component, such as a photovoltaic cell, photodiode, phototransistor, or photomultiplier, which provides a signal in response to a measured intensity of the reflected optical beam. The signal can be in the form of a change in the level of a current passing through an electrical component or a change in a voltage applied across an electrical component. The photodetector 204 can also comprise a spectrometer (array detector with a wavelength-dispersive element) to provide data over a wide wavelength range, such as ultraviolet to visible, from about 170 nm to 800 nm. The reflected optical beam undergoes constructive and/or destructive interference which increases or decreases the intensity of the optical beam, and the photodetector 204 provides an electrical output signal in relation to the measured intensity of the reflected optical beam. The electrical output signal can be plotted as a function of time to provide a spectrum having a waveform pattern corresponding to the varying intensity of the reflected optical beam over time.

The alignment of beam spot 206 to a desired spot location 208 can be effected by adjustment mechanism 162. More particularly, adjustment mechanism 162 can adjust a position of spot location 208 in alignment region 148 by moving focusing optics 150 in a lateral direction 212 or in a tilt direction 214. Adjustment in lateral direction 212 can be parallel to chamber lid 108 in two axes. Lateral adjustment can move the beam spot 206 to the desired spot location 208. This adjustment can be made manually, with a translation stage, or other mechanisms. Adjustment in tilt direction 214 can be made by an actuator, a set screw, or another device suitable for setting an angle of incidence of first light 146 relative to top surface 209 of substrate 114 or substrate support member 112. For example, adjustment mechanism 162 can include a tilt stage. The angle of incidence may be set to be perpendicular to top surface 209. Adjustment of an angle of incidence affects an angle of reflection, and thus, tilt alignment can optimize collection of optical radiation by optimizing an amount of light reflected back toward photodetector 204.

Figure 3:
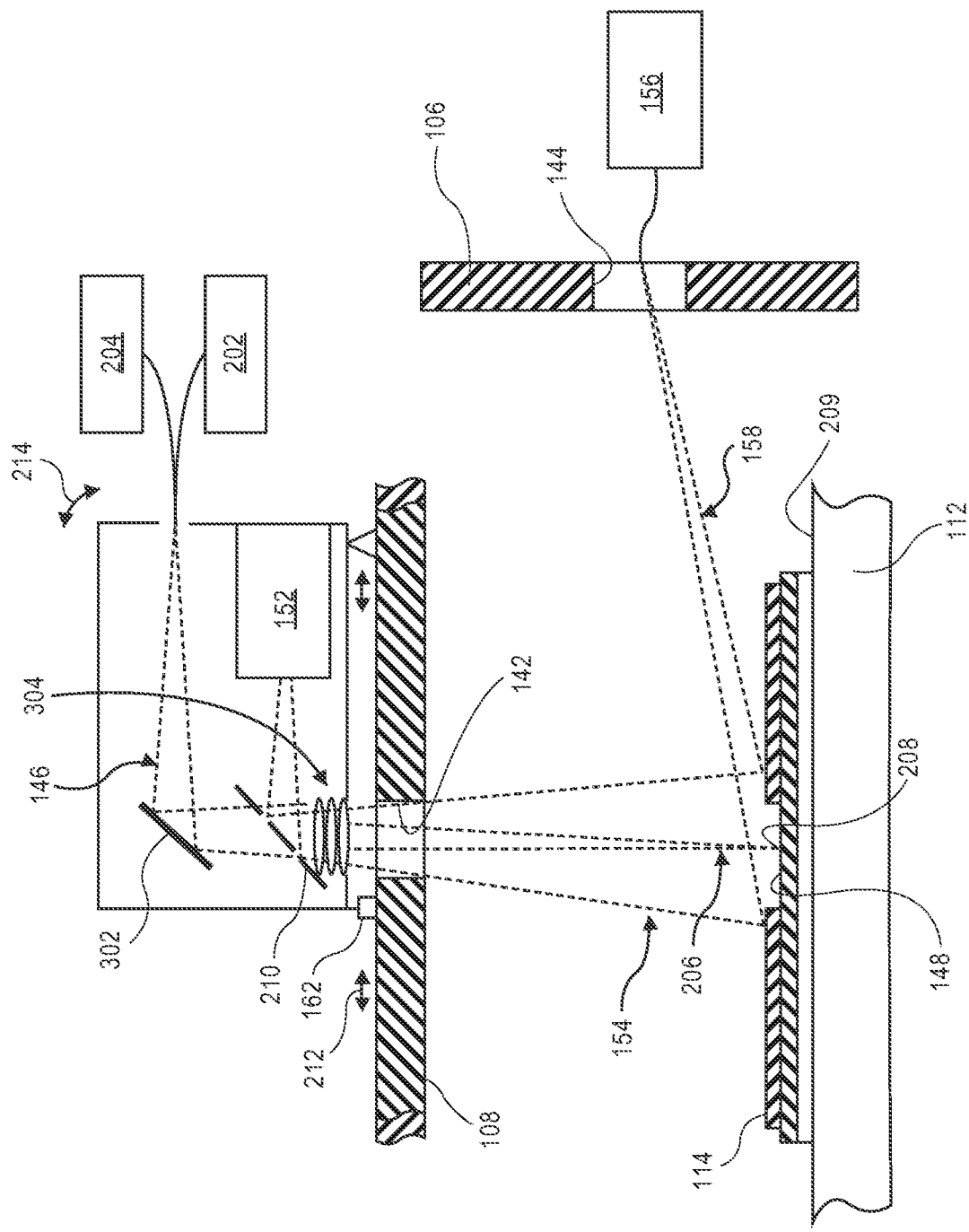
FIG. 3 is a diagram of an optical configuration of an etch processing system, in accordance with an embodiment.

Referring to FIG. 3, a diagram of an optical configuration of an etch processing system is shown in accordance with an embodiment. A configuration of focusing optics 150 may differ in FIG. 3, as compared to FIG. 2. A functionality of focusing optics 150, however, may remain largely the same.

In an embodiment, focusing optics 150 includes a folding mirror 302. Folding mirror 302 reflects first light 146 emitted by light source 202 toward lid window 142. Focusing optics 150 may include several lenses in a lens stack 304 to focus first light 146 into beam spot 206 and to direct first light 146 through lid window 142 to spot location 208 in alignment region 148. Each lens of the lens stack 304 can have a focal length that has minimal variation across a range of wavelengths. Reflection 154, which includes first light 146 and second light 158 within the field of view of camera 152, can be collected by the lens stack 304 and passed to beam splitter 210 for division into a portion that is imaged by camera 152 and a portion that is detected and measured by photodetector 204. In an embodiment (not shown) beam splitter 210 replaces folding mirror 302 to direct first light 146 from light source 202 to alignment region 148.

Lens stack 304 can include one or more convex focusing lenses used to focus the incident optical beam to spot location 208 on the substrate 114 surface, and to focus the reflected optical beam back on the active surface of photodetector 204. Spot location 208 should be sufficiently large to compensate for variations in surface topography of the substrate 114 and device design features. This enables detection of etch endpoints for high aspect ratio features having small openings, such as vias or deep narrow trenches, which may be densely present or more isolated. The area of the reflected optical beam should be sufficiently large to activate a large portion of the active light-detecting surface of the photodetector 204. The incident and reflected optical beams are directed through the transparent lid window 142 in the etch chamber 102 that allows the optical beams to pass in and out of the processing environment.

Figure 4:
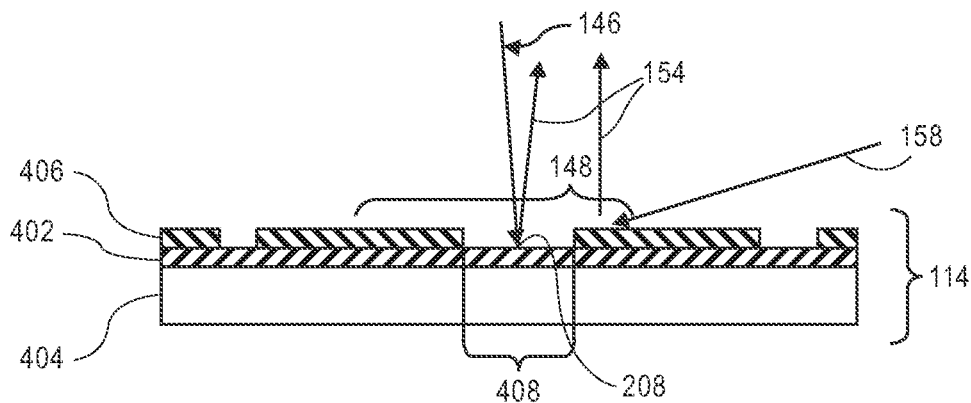
FIG. 4 is a sectional view of a substrate having an alignment opening in a patterned mask layer, in accordance with an embodiment.

Referring to FIG. 4, a sectional view of a substrate having an alignment opening in a patterned mask layer is shown in accordance with an embodiment. In an embodiment, substrate 114 includes an etch layer 402 over a base layer 404. A patterned mask layer 406 may be mounted over or on etch layer 402. For example, patterned mask layer 406 may include several openings to allow etching of the underlying etch layer 402. In an alignment region 148, patterned mask layer 406 includes an alignment opening 408 to receive incident first light 146 in beam spot 206 at spot location 208, and to reflect reflection 154 of beam spot 206 upward from etch layer 402 (or base layer 404 when etch layer 402 is etched away). Similarly, second light 158 may impinge on alignment region 148 and reflect upward to form a portion of reflection 154 within the field of view of camera 152. Reflection 154 can be received by photodetector 204 and camera 152. For example, when etch layer 402 is removed by an etch process, reflection 154 of first light 146 from the underlying base layer 404 may reflect upward through alignment opening 408 toward focusing optics 150 and to camera 152 and/or photodetector 204.

Alignment opening 408 can be at a predetermined location on substrate 114. For example, alignment opening 408 may be near a perimeter or an outer edge of substrate 114, or otherwise off center relative to a center location on substrate 114. In an embodiment, alignment opening 408 is located in a first radial direction, e.g., along an x-axis, from the center location at a distance of 50-75 mm, e.g., 68 mm. Alignment opening 408 may be located in a second radial direction, e.g., along a y-axis, from the center location at a distance of 5-20 mm, e.g., 10 mm. The specific predetermined location may refer to the location of a center point of alignment opening 408, a corner of alignment opening 408 (e.g., when alignment opening 408 is rectangular), or an edge of alignment opening 408 (e.g., when alignment opening 408 is elliptical).

Substrate 114 can include materials such as a quartz photomask, low temperature expansion extreme ultraviolet (EUV) photomask, or a silicon wafer. The etch layer 402 is typically the top layer of substrate 114, i.e., on other base layer(s) of substrate 114, such as anti-reflection EUV layer on an EUV stack on a photomask, or an oxide on silicon. Patterned mask layer 406 is typically photoresist, but can also be hardmask, or other patterned material intended to protect portions of the etch layer 402. Patterned mask layer 406 has been described as being a portion or layer of substrate 114, however, in an embodiment, patterned mask layer 406 may be a separate plate of material held over etch layer 402 of substrate 114.

In an embodiment, beam spot 206 is aligned to alignment opening 408 in patterned mask layer 406. Adjustment mechanism 162 may move a relative location of optical monitoring system 138 and substrate 114 to effect such alignment. Alternatively, an optical beam positioner (not shown) may be used to move the incident optical beam across the substrate 114 to a suitable portion of the substrate surface on which to monitor an etching process. The optical beam positioner may include one or more primary mirrors, which may be part of focusing optics 150, that rotate at small angles to deflect the optical beam from light source 202 onto different positions of the substrate surface. Additional secondary mirrors may be used to direct the reflected optical beam onto photodetector 204. The optical beam positioner may also be used to scan the optical beam in a raster pattern across the surface of the substrate 114. For example, the optical beam positioner may include a scanning assembly consisting of a movable stage, similar to adjustment mechanism 162. The movable stage can be moved through set intervals by a drive mechanism, such as a stepper motor or galvanometer, to scan the beam spot 206 location across the substrate 114. In an embodiment, the movable stage is a portion of adjustment mechanism 162, i.e., optical beam positioner is a subcomponent of adjustment mechanism 162.

A diameter of beam spot 206 at spot location 208 is generally about 2 mm to about 10 mm. When alignment region 148 encompasses large isolated areas of substrate 114 containing only a small number of etched features, however, it may be necessary to use a larger beam spot 206 in order to encompass a greater number of etched features. The size of the beam spot 206 can therefore be optimized, depending on the design features for a particular device. If the signal is sufficient, a large beam spot 206 or field of view will enable process control without precisely matching the position of the alignment opening 408 and the etched area of the substrate 114 giving rise to the monitored signal.

Figure 5:
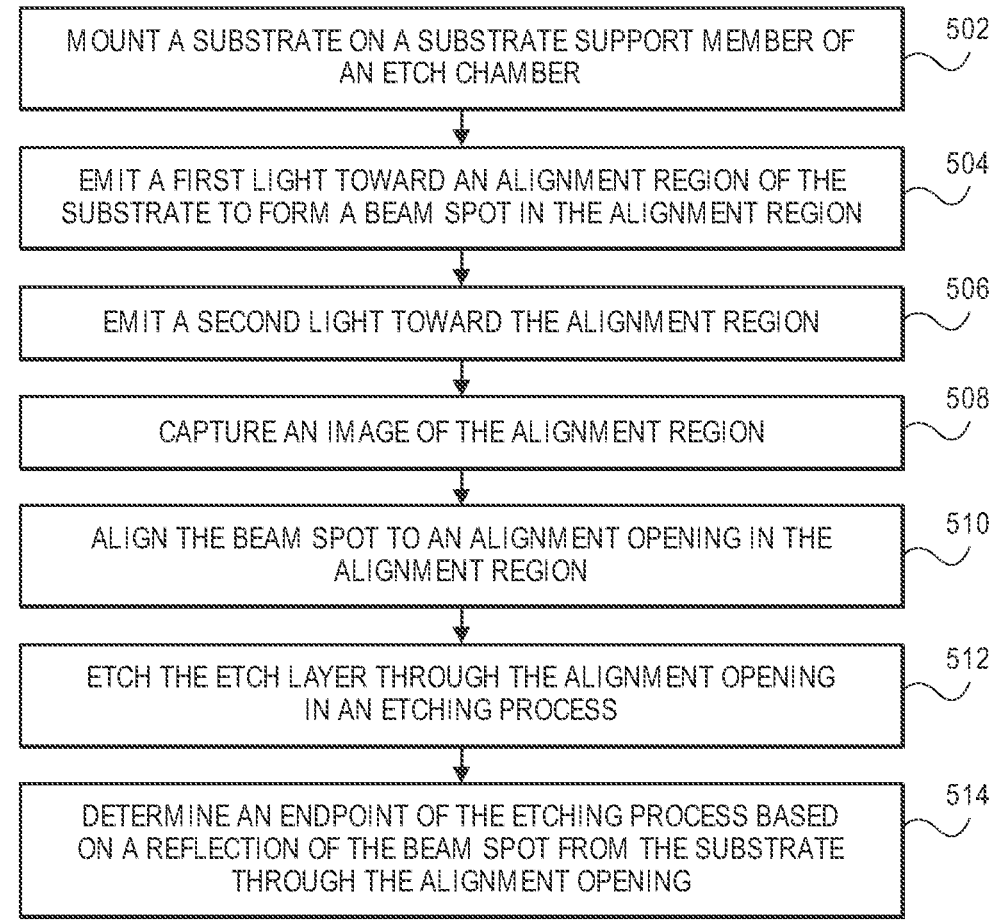
FIG. 5 is a flowchart of a method of determining an endpoint of an etching process, in accordance with an embodiment.

Referring to FIG. 5, a flowchart of a method of determining an endpoint is shown in accordance with an embodiment. Operations of the method of FIG. 5 are illustrated in FIGS. 6A-6B, which show top views of alignment region 148 of substrate 114. Thus, FIGS. 5-6B are described in combination below.

At operation 502, substrate 114 is transferred into etch chamber 102 and mounted on substrate support member 112. In an embodiment, substrate 114 includes patterned mask layer 406. Patterned mask layer 406 may be a photomask, such as a multilayer EUV stack with antireflection layer and absorber layer, or a photomask such as chromium molybdenum silicide on quartz. Patterned mask layer 406 can include openings, e.g., alignment opening 408, which may be considered as a target area at a predetermined location for process monitoring. For a wafer, a target area could be between dies or in a dedicated portion of a die.

At operation 504, first light 146 is emitted toward alignment region 148 of substrate 114. First light 146 can be focused into beam spot 206 on substrate 114 by one or more of curved mirror 205 or lens stack 304 of focusing optics 150. At operation 506, second light 158 is emitted toward alignment region 148. Referring to FIG. 6A, alignment region 148 can correspond to the field of view of camera 152. That is, at operation 508, an image of alignment region 148 can be captured by camera 152. The image can correspond to a total area of alignment region 148 that includes reflection 154 of first light 146 and second light 158 from substrate 114 for viewing by camera 152. After initially mounting substrate 114 and focusing beam spot 206 onto alignment region 148, the captured image indicates that beam spot 206 and alignment opening 408 are misaligned. That is, at least a portion of beam spot 206 may be outside of the edge defining alignment opening 408 in patterned mask layer 406.

At operation 510, beam spot 206 is aligned to alignment opening 408 in alignment region 148. Referring to FIG. 6B, beam spot 206 may be moved laterally across substrate 114 until a perimeter of beam spot 206 is fully contained within a perimeter of the edge of alignment opening 408. The alignment can be based on the image of alignment region 148 captured by camera 152, which shows a position of the reflection of beam spot 206 relative to alignment opening 408. In other words, the radiation from endpoint detection system 140 can be aligned to a desired location on the target area of substrate 114 based on the image(s) captured by camera 152. After alignment, the point light reflected from the beam spot 206 will be solely from the etching surface and not the mask layer.

At operation 512, substrate 114 is etched by etch chamber. The etching process may be performed on the etch substrate 114, etching the exposed areas that are not covered by the patterned mask layer 406, e.g., the target area under alignment opening 408. The etching process performed on substrate 114 can be after aligning beam spot 206 to alignment opening 408. Accordingly, the etching process can remove etch layer 402 through alignment opening 408 at the same time that photodetector 204 measures reflection 154 from etch layer 402 under alignment opening 408.

At operation 514, an endpoint of the etching process is determined based on reflection 154 of beam spot 206. Focused radiation from the endpoint detection system 140 falls on substrate 114 and is reflected. Reflection 154 is collected during the etch process and processed to produce a reflectance signal. The reflectance signal is analyzed during etching to detect an endpoint. The reflectance signal may be analyzed simultaneously as material is removed during etching for endpoint detection. When beam spot 206 reflects from base layer 404 through alignment opening 408 (rather than from etch layer 402 through alignment opening 408) it can be determined that etch layer 402 is absent and the etching process intended to remove etch layer 402 is complete. That is, determining the endpoint can include detecting when etch layer 402 between patterned mask layer 406 and base layer 404 is fully removed under alignment opening 408.

Referring again to FIG. 5, the method of determining an endpoint can be performed similar to the manner described above, with some differences. More particularly, a detection and alignment to the target area may differ between FIGS. 7A-7B and FIGS. 6A-6B. In an embodiment, an alignment substrate may be used to identify the target area. The alignment substrate may be a different substrate than the substrates that are etched by etch processing system 100. More particularly, as shown FIGS. 7A-7B, an alignment substrate may be used that includes an alignment reticle 702.

FIGS. 7A-7B show top views of alignment region 148 of the alignment substrate, which may differ from substrate 114 that is ultimately etched.

In an embodiment, alignment substrate is a substrate, e.g., a quartz substrate, having an upper surface. Alignment reticle 702, e.g., a mask reticle, can be printed or scribed into the upper surface. For example, alignment reticle 702 can be ground into the upper surface to provide a light-scattering surface to enhance contrast as viewed by camera 152. Alignment reticle 702 can include an alignment pattern 702 that has a geometry similar to the geometry of alignment opening 408 in patterned mask layer 406 of substrate 114. For example, alignment reticle 702 can have a same profile and location as a target area on substrate 114.

FIG. 7A shows alignment reticle 702 as a box pattern with markings, e.g., centering lines. Alignment substrate having alignment reticle 702 can be placed within alignment region 148 as imaged by camera 152. Alignment region 148 can be a region over substrate support member 112 at which the target area of substrate 114 will eventually be held. Beam spot 206 may be misaligned with alignment reticle 702 initially, and may be moved into alignment with alignment reticle 702 as shown in FIG. 7B. When beam spot 206 is aligned with alignment reticle 702, beam spot 206 may also be aligned with an area that will eventually contain alignment opening 408. Alignment reticle 702 and alignment opening 408 may have a same profile and location, and thus, once beam spot 206 is aligned to alignment reticle 702, beam spot 206 may be pre-aligned to alignment opening 408 if substrate 114 having a same shape and size as the alignment substrate is mounted on substrate support member 112.

When beam spot 206 is aligned to alignment reticle 702, the alignment substrate may be removed from the chamber volume of chamber body 104, and replaced by substrate 114. That is, substrate 114 may be inserted into the chamber volume and mounted on substrate support member 112. Upon mounting, the target region on substrate 114 may be aligned with beam spot 206, and etching and etch monitoring may take place as described above.

After a first wafer 114 is processed according to the method of FIG. 5, the etch processing system is pre-aligned for all subsequent masks with an identical target area as the first wafer. Accordingly, subsequent wafers may be loaded into etch chamber 102 and mounted on substrate support member 112, and alignment openings 408 of the subsequent wafers may already be aligned with beam spot 206 and not require further alignment, e.g., via operation 510. Verification of alignment may be performed via operations 504-508 before proceeding to the etching process and endpoint detection of operations 512-514. Accordingly, an advantageous method of consistent and accurate endpoint control for production and manufacturing is provided.

Referring to FIGS. 8A-8B, graphs of endpoint traces are shown in accordance with an embodiment. The graphs are provided to further describe how reflectance monitoring can be used for endpoint detection.

The graphs correspond to data that was collected for an EUV etch substrate in which a thin antireflection layer 402 was to be etched. The expected signal is for the reflectance to increase with etch time, then stop increasing and flatten after the layer 402 is removed. This flattening of the optical signal corresponds to an endpoint of the etching process because it occurs at a time when the target etch layer is fully etched.

Referring to FIG. 8A, photodetector 204 can detect a magnitude 802, e.g., an intensity, of reflection 154 of beam spot 206. When beam spot 206 is not aligned to alignment opening 408, e.g., when beam spot 206 is on mask material (FIGS. 6A and 7A), the measured magnitude 802 continues to change over time. For example, the reflectance is dropping during the etch time because the mask layer is becoming thinner during the etch. Patterned mask layer 406 may be thicker than etch layer 402, and thus, the measured reflectance may continue to change beyond an expected time as the layer continues to etch. The signal shown in FIG. 8A does not represent an expected signal during the etching process, and thus, the etching process may fail to stop at a correct time.

Referring to FIG. 8B, beam spot 206 is aligned to alignment opening 408 (FIGS. 6B and 7B). As the etching process continues with time, the reflectance data collected by photodetector 204 can increase to an expected endpoint 804. That is, the magnitude 802 of reflectance can stabilize at an endpoint 804. More particularly, a change of magnitude 802 relative to time can decrease when endpoint 804 of etching process is reached. The decrease in rate change can be identified by computer system 160 to determine endpoint 804 of the etching process is reached, e.g., at operation 514. The etch process is then automatically stopped at the correct time, etching the etch layer 402 successfully.

Computer system 160 may execute instructions stored on a non-transitory computer-readable medium to cause etch processing system 100 to perform any of the operations and functions described above. For example, in addition to the reflectance monitoring described with respect to FIGS. 8A-8B, a computer program on computer system 160 may analyze a shape of a measured waveform pattern of the reflected optical beam to determine endpoint 804 of the etching process. The waveform may have a sinusoidal-like oscillating shape, with the trough of each wavelength occurring when the depth of the etched feature causes the return signal to be 180 degrees out of phase with the return signal reflected by the overlaying layer. The endpoint 804 may be determined by calculating the etch rate using the measured waveform, phase information of the measured waveform and/or comparison of the measured waveform to a reference waveform. As such, the period of the interference signal may be used to calculate the depth and etch rate. The program may also operate on the measured waveform to detect a characteristic waveform, such as, an inflection point indicative of a phase difference between light reflected from different layers. The operations can be simple mathematic operations, such as evaluating a moving derivative to detect an inflection point.

Figure 9:
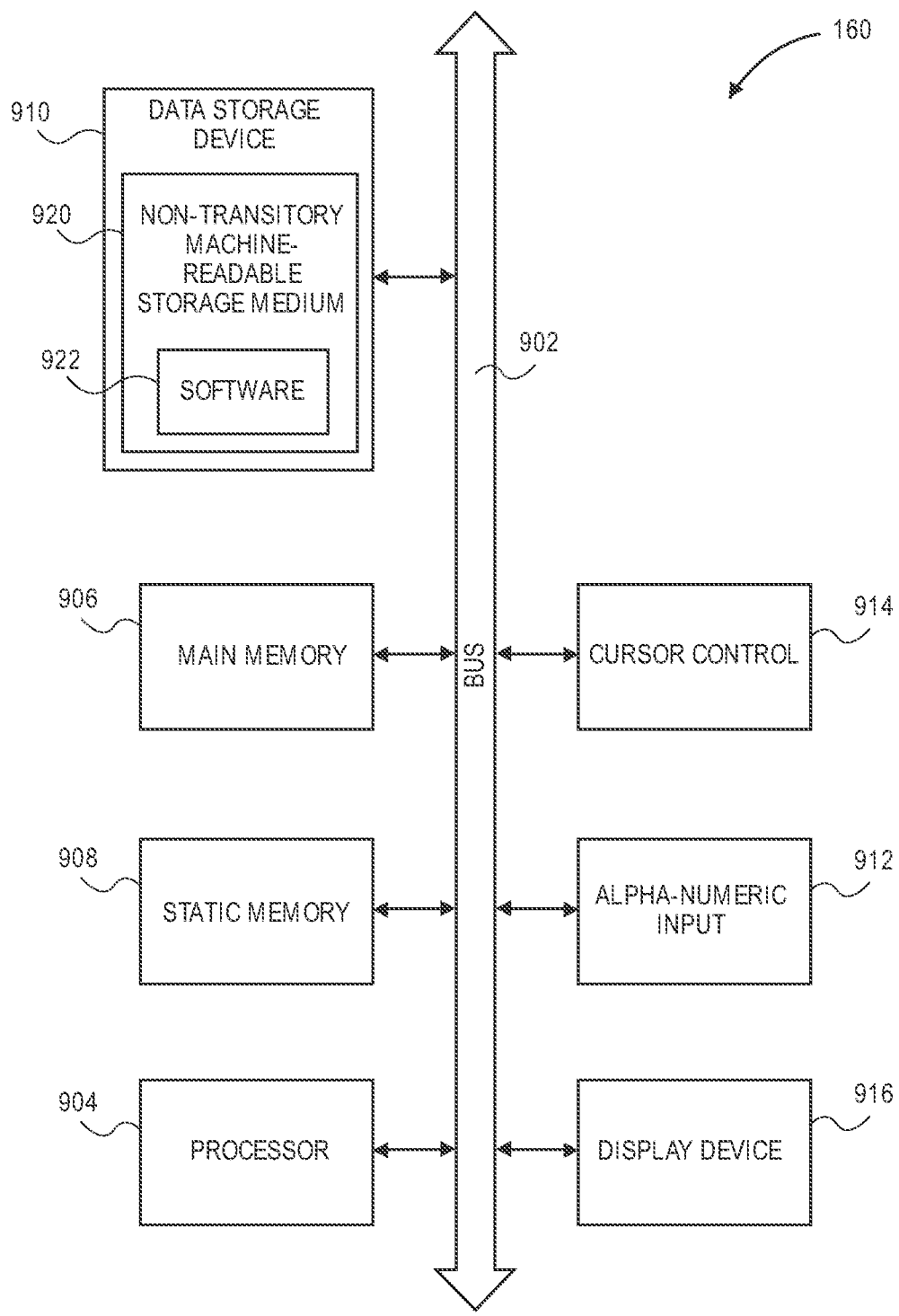
FIG. 9 is a schematic of a computer system, in accordance with an embodiment.

Referring to FIG. 9, a schematic of a computer system is shown in accordance with an embodiment. Portions of embodiments are comprised of or controlled by non-transitory machine-readable and machine-executable instructions which reside, for example, in machine-usable media of a computer system 160. Computer system 160 is exemplary, and embodiments of the invention may operate on or within, or be controlled by a number of different computer systems including general purpose networked computer systems, embedded computer systems, routers, switches, server devices, client devices, various intermediate devices/nodes, stand-alone computer systems, and the like. Computer system 160 may control the subsystems of etch processing system 100 to perform the method operations described above.

Computer system 160 of FIG. 9 includes an address/data bus 902 for communicating information, and a processor 904 coupled to bus 902 for processing information and instructions. Computer system 160 also includes data storage features such as a computer usable volatile memory 906, e.g. random access memory (RAM), coupled to bus 902 for storing information and instructions for processor 904, computer usable non-volatile memory 908, e.g., read only memory (ROM), coupled to bus 902 for storing static information and instructions for the processor 904, and a data storage device 910 (e.g., a magnetic or optical disk and disk drive) coupled to bus 902 for storing information and instructions. Computer system 160 of the present embodiment also includes an optional alphanumeric input device 912 including alphanumeric and function keys coupled to bus 902 for communicating information and command selections to processor 904. Computer system 160 also optionally includes an optional cursor control device 914 coupled to bus 902 for communicating user input information and command selections to processor 904. Computer system 160 of the present embodiment also includes an optional display device 916 coupled to bus 902 for displaying information.

The data storage device 910 may include a non-transitory machine-readable storage medium 920 on which is stored one or more sets of instructions (e.g., software 922) embodying any one or more of the methodologies or operations described herein. Software 922 may also reside, completely or at least partially, within the volatile memory 906, non-volatile memory 908, and/or within processor 904 during execution thereof by the computer system 160, the volatile memory 906, non-volatile memory 908, and processor 904 also constituting non-transitory machine-readable storage media 920.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An etch processing system, comprising:
    an etch chamber having a chamber body around a substrate support member, wherein the etch chamber has a chamber lid and a plurality of lid windows, the plurality of lid windows comprising a first lid window located near a perimeter of the chamber lid radially outward from a center of the chamber lid at a first position, and the plurality of lid windows comprising a second lid window located near the perimeter of the chamber lid at a second position, the second position of the second lid window being circumferentially offset from the first position of the first lid window;
    a substrate mounted on the substrate support member, wherein the substrate includes an alignment region; and
    an endpoint detection system including a light source to emit a first light toward the alignment region over the substrate support member, and a photodetector to receive a reflection of the first light from the alignment region, wherein the circumferential offset provides one of the first lid window or the second lid window vertically above the alignment region regardless of an orientation of the a substrate on the substrate support member.

2. The etch processing system of claim 1 further comprising a camera to image the reflection of the first light and a second light from the alignment region, and wherein the first light travels through the one of the plurality of lid windows toward the alignment region and the reflection of the first light and the second light travel through the one of the plurality of lid windows toward the photodetector and the camera.

3. The etch processing system of claim 2 further comprising a focusing optics to direct the first light through the one of the plurality of lid windows to the alignment region, to direct the reflection of the first light to the photodetector, and to direct the reflection of the first light and the second light to the camera.

4. The etch processing system of claim 3, wherein the focusing optics include one or more of a curved mirror or a plurality of lenses to focus the first light into a beam spot in the alignment region.

5. The etch processing system of claim 4 further comprising an adjustment mechanism operably coupled to one or more of the substrate support member or the endpoint detection system to move a spot location of the beam spot in the alignment region.

6. The etch processing system of claim 3, wherein the focusing optics include a beam splitter between the camera and the one of the plurality of lid windows to direct the reflection of the first light and the second light to the camera.

7. The etch processing system of claim 2 further comprising a second light source to emit the second light toward the alignment region.

8. The etch processing system of claim 7, wherein the first light travels toward the alignment region orthogonal to a top surface of the substrate support member, and wherein the second light travels toward the alignment region oblique to the top surface.

9. An etching process assembly, comprising:
    an etch chamber having a chamber body around a substrate support member, wherein the etch chamber has a chamber lid and a plurality of lid windows, the plurality of lid windows comprising a first lid window located near a perimeter of the chamber lid radially outward from a center of the chamber lid at a first position, and the plurality of lid windows comprising a second lid window located near the perimeter of the chamber lid at a second position, the second position of the second lid window having a circumferential offset from the first position of the first lid window;
    a substrate mounted on the substrate support member, wherein the substrate includes an alignment region having an etch layer over a base layer, and a patterned mask layer over the etch layer, and wherein the patterned masked layer includes an alignment opening, wherein the circumferential offset provides one of the first lid window or the second lid window vertically above the alignment region regardless of an orientation of the substrate on the substrate support member;
    an endpoint detection system including a light source to emit a first light toward the alignment region of the substrate and a photodetector to receive a reflection of the first light from the base layer through the alignment opening; and
    a camera to image the reflection of the first light and a second light from the alignment region.

10. The etch processing system of claim 9, wherein the reflection of the first the first light and the second light travel to the camera from the alignment region through the one of the plurality of lid windows.

11. The etching process assembly of claim 10 further comprising a focusing optics to focus the first light into a beam spot within the alignment opening.

12. The etching process assembly of claim 9 further comprising a second light source to emit the second light toward the alignment region.

13. The etching process assembly of claim 12, wherein the first light is directed into the alignment opening orthogonal to a top surface of the patterned mask layer, and wherein the second light is directed onto the alignment region oblique to the top surface.

* * * * *